United States Patent
Hsiao et al.

[11] Patent Number: 5,985,765
[45] Date of Patent: Nov. 16, 1999

[54] METHOD FOR REDUCING BONDING PAD LOSS USING A CAPPING LAYER WHEN ETCHING BONDING PAD PASSIVATION OPENINGS

[75] Inventors: Yung-Kuan Hsiao, Hsin-Chu; Cheng-Ming Wu, Kaoshiung; Yu-Hua Lee, Hsinchu, all of Taiwan

[73] Assignee: Taiwan Semiconductor Manufacturing Company, Ltd., Hsin-Chu, Taiwan

[21] Appl. No.: 09/075,368

[22] Filed: May 11, 1998

[51] Int. Cl.⁶ .................................................. H01L 21/00
[52] U.S. Cl. ..................... 438/694; 438/702; 438/706; 438/720
[58] Field of Search ...................... 438/689, 694, 438/695, 699, 702, 703, 706, 714, 719, 720, 734, 740

[56] References Cited

U.S. PATENT DOCUMENTS

| | | | |
|---|---|---|---|
| 5,290,588 | 3/1994 | Romero et al. | 427/123 |
| 5,384,284 | 1/1995 | Doan et al. | 437/190 |
| 5,403,777 | 4/1995 | Bryant et al. | 437/183 |
| 5,705,428 | 1/1998 | Liu et al. | 437/192 |
| 5,716,218 | 2/1998 | Fornworth et al. | 438/734 |
| 5,789,303 | 8/1998 | Leung et al. | 438/381 |
| 5,821,160 | 10/1998 | Rodriguez et al. | 438/601 |
| 5,891,808 | 4/1999 | Chang et al. | 438/738 |

Primary Examiner—Benjamin Utech
Assistant Examiner—Kin-Chan Chen
Attorney, Agent, or Firm—George O. Saile; Stephen B. Ackerman

[57] ABSTRACT

A method for reducing bonding pad loss is achieved using a capping layer when contact openings are etched to the bonding pads, while concurrently etching much deeper fuse openings to the substrate. Bonding pads are used on the top surface of integrated circuit semiconductor chips to provide external electrical connections for I/Os and power. And fuses are used in the underlying insulating layers to remove redundant defective circuit elements and thereby repair defective chips. It is desirable (cost effective) to etch the contact openings in the passivation layer to the bonding pads near the top surface on the chip and to concurrently etch the much deeper fuse openings in the thick underlying insulating layers over the fuses. However, because of the difference in etch depth of the two types of openings, the bonding pads composed of Al/Cu are generally overetched causing bond-pad reliability problems. This invention uses a novel process in which a capping layer, having a low etch rate, is formed on the bonding pads to prevent overetching while the fuse openings are etched to the desired depth in the thicker insulating layers.

20 Claims, 3 Drawing Sheets

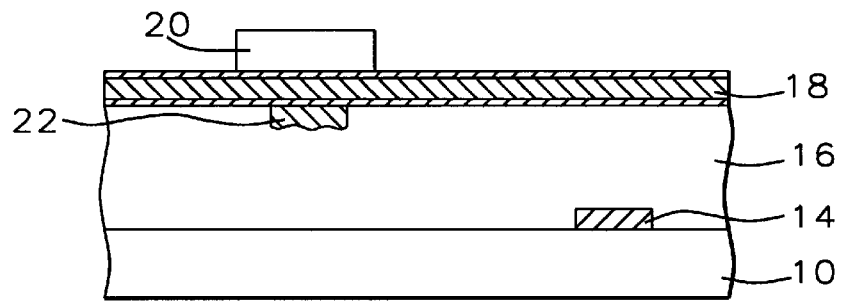
FIG. 1 – Prior Art
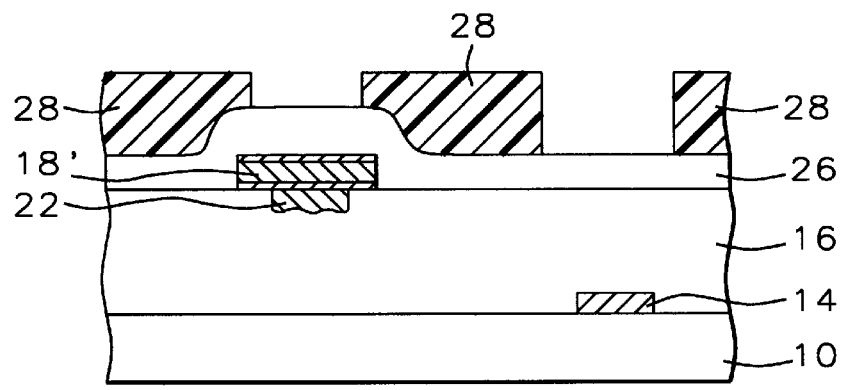
FIG. 2 – Prior Art
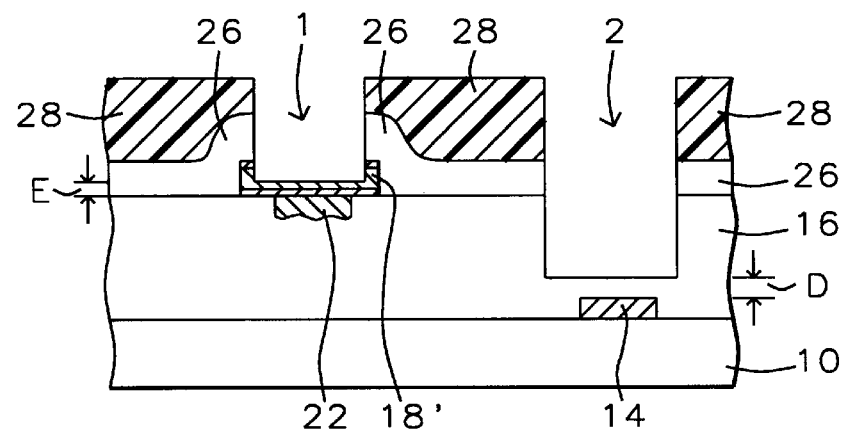
FIG. 3 – Prior Art

METHOD FOR REDUCING BONDING PAD LOSS USING A CAPPING LAYER WHEN ETCHING BONDING PAD PASSIVATION OPENINGS

BACKGROUND OF THE INVENTION

(1) FIELD OF THE INVENTION

The present invention relates to the fabrication of integrated circuits, and more particularly to a method for making more reliable bonding pads using a capping layer. This method eliminates the overetching of the bonding pads when the bonding pad openings are etched, while concurrently etching deeper fuse openings in the underlying insulating layers to the polysilicon fuse near the substrate surface.

(2) DESCRIPTION OF THE PRIOR ART

The reduction of the feature sizes of semiconductor devices using advanced semiconductor techniques, such as high-resolution lithography and directional etching, have dramatically increased the device packing density on integrated circuit chips formed on the substrate. However, as the device packing density increases, it is necessary to increase the number of electrical metal interconnect layers on the chip to effectively wire up the discrete devices on the substrate while reducing the chip size. For example, it is not uncommon to use between two and six levels of metal interconnect layers. Typically after completing the multilevel interconnect structure, bonding pads are formed on the top surface of the interconnect structure to provide external electrical connections to the chip. A passivation layer is then applied, such as a phosphorous doped glass, a silicon nitride, a silicon oxynitride layer, or a combination of these layers to passivate the chip from moisture and contamination.

Another concern as the density of the semiconductor devices increases on the chip is that the final product yield for many integrated circuits (chip yield) can dramatically decrease. For example, one circuit device that can experience this yield loss with increased device density is the dynamic random access memory (DRAM) currently having 64 megabits of memory on a chip. After the year 2000 the number of memory cells is expected to increase further to about 1 to 4 gigabits, and high final product yield will be difficult to achieve without utilizing cell redundancy and repair yield methods. One method of overcoming this lower yield on RAM devices is to provide additional rows of memory cells and fusing each row of cells. A laser is then used to open connections (fuses) in the patterned polysilicon layers on the substrate that are used to form the DRAM or SRAM devices. By this means defective rows of memory cells can be disabled and the address decoder circuits can be modified so that spare rows of memory cells are selected instead. To achieve this laser deletion, it is necessary to etch deep openings through the multilevels of insulating layers in the multilevel metal interconnect structure over the fuse portions of the patterned polysilicon layer. It is also common practice in the semiconductor industry to etch the bonding pad openings and the fuse openings using the same masking step to reduce manufacturing cost. Unfortunately, when the fuse openings are etched in the thick multilevels of insulation, the bonding pad openings can be overetched, essentially eroding away a major portion of the bonding pad causing reliability concerns.

To better appreciate this overetch problem, FIGS. 1–3 depict the problem of the prior art and are briefly described. The drawing in FIG. 1 is a schematic cross-sectional view showing a portion of a substrate 10 having an integrated circuit completed up to and including the bonding pad layer. The semiconductor devices formed on the substrate typically include patterned polysilicon layers that also serve as local interconnections which include portions for fuses 14, as shown in FIG. 1. For example, the polysilicon layer can be used to form the gate electrodes for field effect transistors (FETs) or bit lines on DRAM devices. A multilevel interconnect structure 16 is then formed over the devices to complete the electrical interconnections on the chip. Typically the interconnect structure 16 is composed of several layers of patterned metal, such as aluminum/copper (AlCu), with alternating insulating layers, such as silicon oxide ($SiO_2$) or low dielectric insulators. Metal plugs are formed in the insulating layers as electrical interconnects between metal layers. The details of the interconnect structure 16 are not essential to understanding the problem and are therefore not depicted in detail in the Figs. to simplify the drawings and the discussion. As shown in FIG. 1, the bonding pad layer 18 is typically formed by depositing a multilayer conducting layer such as titanium nitride-AlCu-titanium nitride layers to a thickness of 9000 Angstroms. Bonding pads 18' are then formed by using a patterned photoresist etch mask 20 and conventional plasma etching to pattern the bonding pad layer 18, as shown in FIGS. 1 and 2. The bonding pads 18' are typically used to make external electrical connections to the chip for the I/O signals (input/output signals) and to provide power for the chip. FIG. 2 shows one of the bonding pads 18' making contact to one of the metal plugs 22 in the multilevel interconnect structure 16 as part of the electrical interconnections. Still referring to FIG. 2, a passivation layer 26 is deposited over the substrate to prevent moisture and contamination of the integrated circuits. Typically the passivation layer is composed of a doped glassy a silicon nitride, silicon oxynitride, or a combination of these insulating materials to prevent moisture and/or ion contamination from corroding and electrically degrading the semiconductor devices, respectively.

Still referring to FIG. 2 and more specifically to the nature of the problem, a photoresist layer 28 is patterned to form an etch mask for etching openings 1 in the passivation layer 26 to the bonding pads 18' while concurrently openings 2 are etched in the passivation layer and in the underlying insulating layers of the multilevel interconnect structure over the fuses 14, as shown in FIG. 3. However, because of the excessive etching in the relatively thick insulating layers, about 55,000 Angstroms, it is difficult to etch the fuse openings 2 to within the required depth D of 5000+/−3000 Angstroms without overetching the bonding pads 18' in the openings 1. As shown in FIG. 3, this overetching of the bonding pads results in a thinning of the bonding pads to a thickness E that is less than 4000 Angstroms, which causes reliability problems. The current etching conditions do not provide sufficient etch selectivity between the passivation layer and the bonding pads to prevent this overetching. For example, the current etching gases, such as $CF_4$/$CHF_3$/Ar, and etching parameters, such as at about 1100 Watts of power, can result in AlCu etch rates of 300 to 400 Angstroms per minute.

One method of forming bonding pads is described by Bryant et al., U.S. Pat. No. 5,403,777, in which bonding pads are formed in the shape of grid, and a second conducting layer is deposited to prevent pad lift-off. Another method for making low-resistance bond-pad interconnects is described by Doan et al., U.S. Pat. No. 5,384,284. The method uses an intermediate conducting layer to prevent $Al_2O_3$ from forming on the Al bond pads, thereby preventing high resistance. In U.S. Pat. No. 5,290,588 by Romero et al., a method is described for eliminating "purple plague" which is an undesirable reaction of the gold (Au) layer on Al bonding pads. The method utilizes a TiW layer between the Al and the Au and an inert atmosphere anneal to form stable TiAl$_3$ phase that prevents inter-diffusion between the Al and the Au. Liu et al. in U.S. Pat. No. 5,705,428 describe a method for preventing Ti lifting during and after metal etching by adding nitrogen during plasma etching, or during photoresist plasma strip, using an oxygen stream ambient. However, none of these references addresses the overetch bonding-pad problem described.

There is still a strong need in the semiconductor industry to provide a method for etching openings in a passivation layer to bonding pads and concurrently etching openings to the fuses without overetching the bonding pads.

SUMMARY OF THE INVENTION

It is a principal object of the present invention to provide a method for making more reliable bonding pads, using a capping layer that allows the bonding pad contact openings to be etched without overetching the bonding pads, when fuse openings are concurrently etched in the insulating layers over the fuses on integrated circuits.

A method is provided for forming improved bonding pads without overetching the openings to the bonding pads while concurrently etching much deeper openings over fuses in the underlying insulating layers of a multilevel interconnect structure. The method accurate control of the remaining oxide thickness (5000+/−3000 Angstroms) over the fuse, which is necessary for good repeatable laser repair of the integrated circuits by deleting defective circuits.

A method for fabricating reliable bonding pads for integrated circuits begins by providing a semiconductor substrate having completed semiconductor devices in device areas, which include patterned polysilicon layers. The polysilicon layers also serve as part of the electrical interconnections that include portions for fuses. A multilevel of patterned conducting layers, with alternating insulating layers having interconnecting conducting plugs, is formed to provide electrical interconnections for the devices.

Next a bonding-pad conducting layer, such as titanium nitride/aluminum copper/titanium nitride (TiN/AlCu/TiN) is deposited over the topmost insulating layer of the interlevel interconnect structure and making contact to the necessary interconnecting conducting plugs. Now, a key feature of the invention, a capping layer, which is used as an etch-stop layer, is then deposited over the conducting layer for the bonding pads. One preferred type of capping layer that has a low etch rate during oxide etching is tungsten (W). The capping layer and the bond-pad conducting layer are then patterned to form the bonding pads over the interconnecting conducting metal plugs. After forming the bonding pads, a passivation layer is deposited to seal the integrated circuits on the substrate from contamination and moisture, and also to provide scratch protection. Contact openings are etched in the passivation layer to the capping layer on the bonding pads, which prevents overetching the bonding pads while concurrently etching fuse openings through the passivation layer and the underlying insulating layers to the required depth in the insulating layers over the fuses. The capping layer in the contact openings over the bonding pads is then selectively etched to complete the process for making reliable bonding pads.

BRIEF DESCRIPTION OF THE DRAWINGS

The object and other advantages of the invention are best understood with reference to the preferred embodiment when read in conjunction with the following drawings.

FIGS. 1 through 3 are schematic cross-sectional views of the prior art showing a portion of a semiconductor substrate depicting the problem of overetching the bonding pads when concurrently etching deeper fuse openings.

DESCRIPTION OF THE PREFERRED EMBODIMENT

The present invention relates to a method for forming more reliable bonding pads during etching of contact openings over the bonding pads while concurrently etching deeper openings in the insulating layer of the interconnect structure over the fuses. The method for making these reliable bonding pads using a capping layer, while also providing fuse openings, is particularly useful for deleting the redundant rows of defective memory cells on DRAM devices. However, it should be understood by one skilled in the art that the method also applies to making reliable bonding pads on integrated circuits, in general, where fuses are required.

To put the invention in better perspective, the steps for fabricating integrated circuits on which the bonding pads are used are described briefly.

Figure 4:
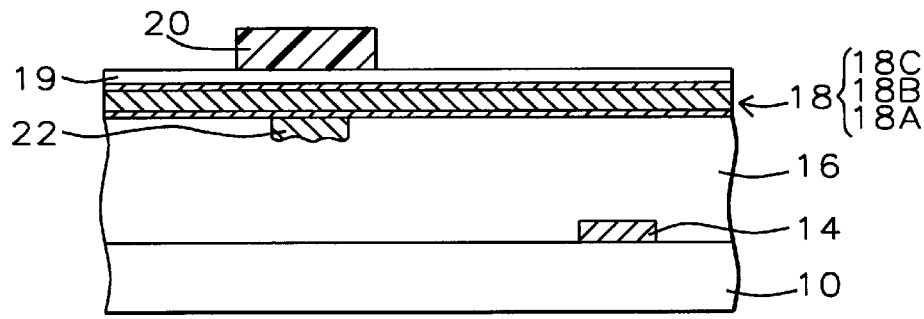
FIGS. 4 through 7 are schematic cross-sectional views of the current invention showing a portion of a semiconductor substrate depicting the process using a capping layer that prevents overetching the bonding pads when concurrently etching the deeper fuse openings.

Referring first to FIG. 4, the method for making integrated circuits begins by providing a semiconductor substrate 10 having completed semiconductor devices, such as field effect transistors in device areas. The substrate 10 is typically a single-crystal silicon substrate, and the semiconductor devices are typically formed in and on the substrate, and usually include doped patterned polysilicon layers used, for example, as gate electrodes for FETs. Additionally other patterned conducting layers, such as a second polysilicon layer, can be included such as for forming bit lines on DRAM devices. The patterned polysilicon layers also serve as interconnections, and can include portions for fuses 14, as shown in FIG. 4. These partially completed circuits are then interconnected to complete the integrated circuit by using a multilevel of patterned conducting layers with alternating insulating layers, shown as 16 in FIG. 4. The multilevel metal interconnect structure 16, hereafter referred to as the interconnect structure, is not described in detail to simplify the drawings and the discussion. Typically the interconnect structure is formed from patterned electrically conducting layers, such as AlCu, and having alternating insulating layers, composed of a silicon oxide (SiO$_2$) or a low-dielectric constant oxide. Interconnecting conducting plugs are formed in the insulating layers between the patterned conducting layers. One of the numerous conducting plugs 22 is depicted in FIG. 4, where a bonding pad is to be built. Typically for embedded DRAMs having four metal layers in the interconnect structure 16, the total thickness of the insulating layers is about 55000 Angstroms.

Still referring to FIG. 4, the method for making the improved bonding pad openings is now described in more detail. A conducting layer 18 is deposited on the topmost insulating layer of the interconnect structure 16 from which the bonding pads are formed. Layer 18 is preferably a multilayer composed of a titanium nitride (TiN) layer 18A, an AlCu layer 18B, and a second TiN layer 18C. The preferred deposition of the TiN layer 18A is by of sputter deposition from a titanium target using argon plasma and nitrogen as a reactant gas. For example, the TiN can be deposited using an Endura model, manufactured by Applied Materials Company of U.S.A. The TiN layer 18A is deposited to a preferred thickness of between about 500 and 1500 Angstroms. The AlCu layer 18B can also be deposited by rf sputter deposition from a composite target of Al and Cu. Layer 18B is deposited to a preferred thickness of between about 6000 and 10000 Angstroms. The upper TiN layer 18C is then deposited similar to the first TiN layer 18A, and to a thickness of between about 200 and 500 Angstroms.

Now, a key feature of the invention and continuing with FIG. 4, a capping layer 19, which is later used as an etch-stop layer, is deposited over layer 18. The capping layer is preferably composed of tungsten (W), and is deposited by sputter deposition, for example from a W target. Layer 19 can also be deposited by CVD using tungsten hexafluoride ($WF_6$). The preferred thickness of layer 19 is between about 500 and 2000 Angstroms, and more specifically is deposited to a thickness of 1000 Angstroms. Alternatively, the capping layer 19 can be composed of other materials having a low etch-rate ratio to $SiO_2$. For example, a tungsten silicide ($WSi_x$) can also be used, and deposited to the same thickness as the tungsten.

Figure 5:
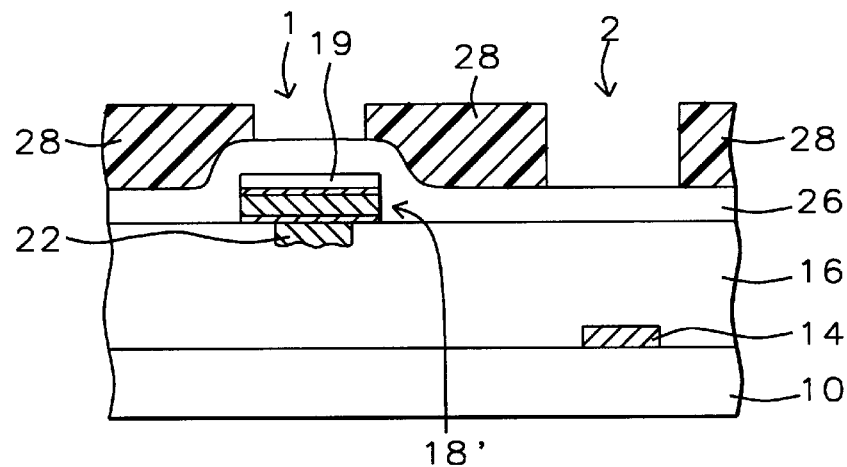

Conventional photolithographic techniques are then used to form a photoresist etching mask 20 on the capping layer 19, and is used to pattern layers 19, 18C, 18B, and 18A to form the bonding pads 18', as shown in FIG. 5.

Referring to FIG. 5, anisotropic plasma etching and the etch mask 20 are then used to form the bonding pads 18' having the capping layer 19 as an etch-stop layer. Layer 18 is patterned to form the array of bonding pads in each chip area on the substrate. One of the bonding pads 18' having the etch-stop capping layer 19 formed over a portion of one of the metal plugs 22 in the interconnect structure 16 is depicted in FIG. 5.

Preferably the anisotropic plasma etching to form the bonding pads 18' is carried out in a reactive ion etcher using an etchant gas mixture such as chlorine ($Cl_2$) and/or boron trichloride ($BCl_3$), and a carrier gas such as argon (Ar).

Still referring to FIG. 5 and after forming the bonding pads 18', a passivation layer 26 is deposited to seal the integrated circuits on the substrate from contamination and moisture, and also to provide scratch protection. One method of forming the passivation layer 26 is to form a multilayer consisting of a relatively thin barrier layer composed of $Si_3N_4$, a spin-on glass (SOG) layer, and a silicon oxynitride layer, having a total thickness of between about 6000 and 12000 Angstroms.

Figure 6:
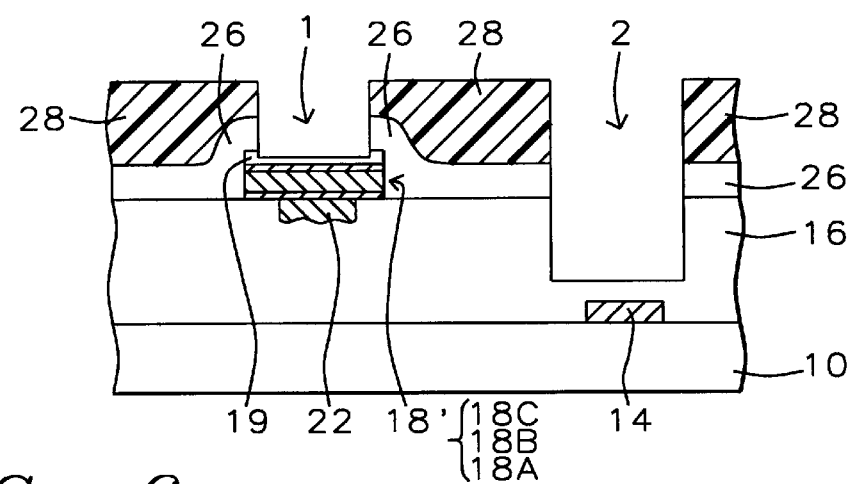

Referring now to FIG. 6, contact openings 1 are etched in the passivation layer 26 to the capping layer 19 on the bonding pads 18'. The capping layer 19 prevents overetching the bonding pads 18' while the fuse openings 2 are concurrently etched in the passivation layer 26 and the thick underlying insulating layers in the interconnect structure 16 to the required depth in the insulating layers over the fuses 14. By way of example only, the openings 1 and 2 can now be etched by conventional anisotropic plasma etching using an etchant gas of carbon tetrafluoride ($CF_4$) and trifluoromethane ($CHF_3$), and a carrier gas such as Ar. The capping layer 19, composed of W, over the bonding pads 18' serves as an etch-stop layer having an etch rate that is less than 100 Angstroms per minute, compared to the AlCu etch rate which would etch at 300–400 Angstroms per minute. This allows the fuse openings 2 to be etched in the insulating layers in the interconnect structure 16 to a depth D that is within 5000+/−3000 Angstroms over the fuse 14, while the 1000 Angstrom thick tungsten (W) capping layer 19, which etches at about 100 Angstrom per minute, and the top TiN layer 18C prevent little, if any loss of the AlCu 18B in the bonding pad 18', resulting in a thickness E equal to the thickness of layers 18A and 18B of between about 7000 and 8500 Angstroms. Without the capping layer 19, the AlCu in the bonding pads would be overetched to a thickness less than 4000 Angstroms causing severe reliability problems. The novel bond pads of this invention, with the capping layer 19, therefore prevent the AlCu from overetching and provide more reliable bonding pads.

Figure 7:
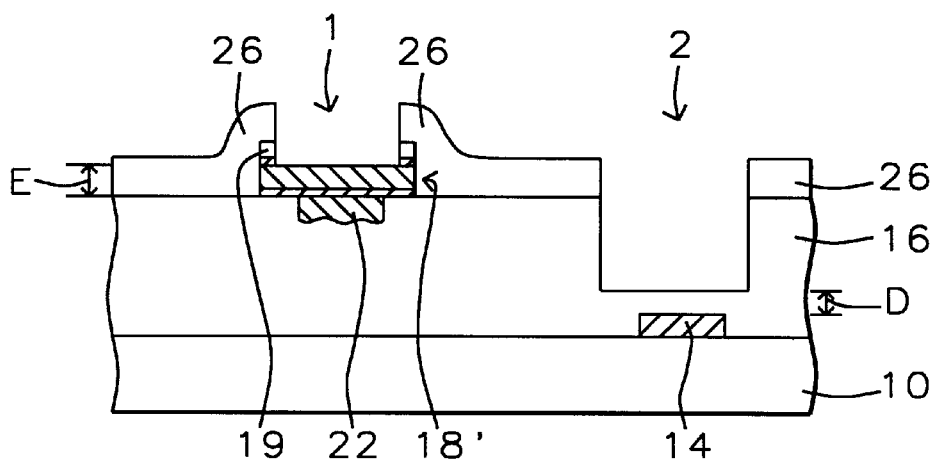

Referring to FIG. 7, any remaining tungsten capping layer 19 in the contact openings 1 over the bonding pads is then selectively etched to complete the integrated circuit up to and including the bonding pads. The remaining capping layer 19 can be etched using a high-density plasma (HDP) etcher and an etchant gas such as sulfur hexafluoride ($SF_6$).

While the invention has been particularly shown and described with reference to the preferred embodiment thereof, it will be understood by those skilled in the art that various changes in form and details may be made without departing from the spirit and scope of the invention.

What is claimed is:

1. A method for fabricating bonding pads for integrated circuits comprising the steps of:

providing a semiconductor substrate having devices formed from a patterned polysilicon layer in device areas that are surrounded by a field oxide isolation, and further having a multilevel of patterned conducting layers, with alternating insulating layers having interconnecting conducting plugs to provide electrical interconnections between said patterned conducting layers for said devices;

depositing a bond-pad conducting layer over the topmost insulating layer of said multilevel and over said interconnecting conducting plugs;

depositing a capping layer over said bond-pad conducting layer to provide an etch-stop layer;

patterning said capping layer and said bond-pad conducting layer to form bonding pads for integrated circuits;

depositing a passivation layer over said bonding pads;

selectively etching contact openings in said passivation layer over said bonding pads wherein said capping layer prevents said selective etching from etching said bonding pads, while concurrently etching fuse openings through said passivation layer and said insulating layers of said multilevel and leaving a portion of said insulating layers over portions of said underlying patterned polysilicon layer that serve as fuses;

selectively etching said capping layer in said contact openings to complete said bonding pads and said fuse openings for said integrated circuits.

2. The method of claim 1, wherein said patterned conducting layers of said multilevel are composed of a metal.

3. The method of claim 2, wherein said metal is aluminum/copper (AlCu) alloy.

4. The method of claim 1, wherein said insulating layers of said multilevel are silicon oxide.

5. The method of claim 1, wherein said bond-pad conducting layer is composed of a titanium nitride layer, an aluminum copper layer, and a titanium nitride layer, where said titanium nitride layers have a thickness of between about 500 and 1500 Angstroms, and said aluminum copper layer has a thickness of between about 6000 and 10000 Angstroms.

6. The method of claim 1, wherein said capping layer is tungsten, and has a thickness of between about 500 and 2000 Angstroms.

7. The method of claim 1, wherein said passivation layer is composed of silicon nitride, a spin-on glass (SOG), and silicon oxynitride, and is deposited to a thickness of between about 6000 and 12000 Angstroms.

8. The method of claim 1, wherein said selective etching of said contact openings and said fuse openings is carried out using high-density plasma etching and an etchant gas mixture of carbon tetrafluoride, trifluoromethane, and argon, and said selective etching has an etch-rate ratio of said passivation layer and said insulating layers to said capping layer sufficiently high to prevent etching into said bonding pads.

9. The method of claim 1, wherein said capping layer exposed in said contact openings is selectively etched to expose said bonding pads while essentially leaving unetched said portions of said insulating layers in said fuse openings over said fuses.

10. The method of claim 9, wherein said etching of said bonding pads is carried out using high-density plasma etching and an etchant gas mixture of chlorine, boron trichloride, and argon.

11. A method for fabricating bonding pads for integrated circuits comprising the steps of:

providing a semiconductor substrate having devices formed from a patterned polysilicon layer in device areas that are surrounded by a field oxide isolation, and further having a multilevel of patterned conducting layers, with alternating insulating layers having interconnecting conducting plugs to provide electrical interconnections between said patterned conducting layers for said devices;

depositing a bond-pad conducting layer over the topmost insulating layer of said multilevel and over said interconnecting conducting plugs;

depositing a capping layer composed of tungsten over said bond-pad conducting layer to provide an etch-stop layer;

patterning said capping layer and said bond-pad conducting layer to form bonding pads for integrated circuits;

depositing a passivation layer over said bonding pads;

selectively etching contact openings in said passivation layer over said bonding pads wherein said capping layer prevents said selective etching from etching said bonding pads, while concurrently etching fuse openings through said passivation layer and said insulating layers of said multilevel and leaving a portion of said insulating layers over portions of said underlying patterned polysilicon layer that serve as fuses;

selectively etching said capping layer in said contact openings to complete said bonding pads and said fuse openings for said integrated circuits.

12. The method of claim 11, wherein said patterned conducting layers of said multilevel are composed of a metal.

13. The method of claim 12, wherein said metal is aluminum/copper (AlCu) alloy.

14. The method of claim 11, wherein said insulating layers of said multilevel are silicon oxide.

15. The method of claim 11, wherein said bond-pad conducting layer is composed of a titanium nitride layer, an aluminum copper layer, and a titanium nitride layer, where said titanium nitride layers have a thickness of between about 500 and 1500 Angstroms, and said aluminum copper layer has a thickness of between about 6000 and 10000 Angstroms.

16. The method of claim 11, wherein said tungsten is deposited by chemical vapor deposition using a reactant gas of tungsten hexafluoride, and where said tungsten is deposited to a thickness of between about 500 and 2000 Angstroms.

17. The method of claim 11, wherein said passivation layer is composed of silicon nitride, a spin-on glass (SOG), and silicon oxynitride, and is deposited to a thickness of between about 6000 and 12000 Angstroms.

18. The method of claim 11, wherein said selective etching of said contact openings and said fuse openings is carried out using high-density plasma etching and an etchant gas mixture of carbon tetrafluoride, trifluoromethane, and argon, and said selective etching has an etch-rate ratio of said passivation layer and said insulating layers to said capping layer sufficiently high to prevent etching into said bonding pads.

19. The method of claim 11, wherein said capping layer exposed in said contact openings is selectively etched to expose said bonding pads while essentially leaving unetched said portions of said insulating layers in said fuse openings over said fuses.

20. The method of claim 19, wherein said etching of said bonding pads is carried out using high-density plasma etching and an etchant gas mixture of chlorine, boron trichloride, and argon.

* * * * *